United States Patent [19]
Dodson

[11] Patent Number: 5,225,368
[45] Date of Patent: Jul. 6, 1993

[54] METHOD OF PRODUCING STRAINED-LAYER SEMICONDUCTOR DEVICES VIA SUBSURFACE-PATTERNING

[75] Inventor: Brian W. Dodson, Albuquerque, N. Mex.

[73] Assignee: The United States of America as represented by the United States Department of Energy, Washington, D.C.

[21] Appl. No.: 652,737

[22] Filed: Feb. 8, 1991

[51] Int. Cl.$^5$ .................. H01L 21/322; H01L 21/324
[52] U.S. Cl. .................. 437/126; 437/133; 437/174; 437/247; 437/40
[58] Field of Search .................. 437/40, 82, 105, 107, 437/126, 127, 129, 133, 247, 111, 174

[56] References Cited

U.S. PATENT DOCUMENTS

| | | | |
|---|---|---|---|
| 4,571,486 | 2/1986 | Arai et al. | 219/354 |
| 4,585,491 | 4/1986 | Burnham et al. | |
| 4,605,447 | 8/1986 | Brotherton et al. | |
| 4,654,090 | 3/1987 | Burnham et al. | |
| 4,727,555 | 2/1988 | Burnham et al. | 372/45 |
| 4,751,194 | 6/1988 | Cibert et al. | 437/24 |
| 4,771,010 | 9/1988 | Epler et al. | 437/19 |
| 4,806,996 | 2/1989 | Luryi | |
| 4,835,116 | 5/1989 | Lee et al. | 437/111 |
| 4,876,210 | 10/1989 | Barnett et al. | 437/5 |
| 4,876,219 | 10/1989 | Eshita et al. | 437/126 |
| 4,927,471 | 5/1990 | Okuda | 437/107 |

FOREIGN PATENT DOCUMENTS 0319207 6/1989 European Pat. Off. .......... 437/129

OTHER PUBLICATIONS

Tsao et al., "Excess Stress and the Stability of Strained Heterostructures", Appl. Phys. Lett. vol. 53, No. 10, Sep. 5, 1988, pp. 848-850.

Primary Examiner—Mary Wilczewski
Attorney, Agent, or Firm—Karla Ojanen; James H. Chafin; William R. Moser

[57] ABSTRACT

A method is described for patterning subsurface features in a semiconductor device, wherein the semiconductor device includes an internal strained layer. The method comprises creating a pattern of semiconductor material over the semiconductor device, the semiconductor material having a predetermined thickness which stabilizes areas of the strained semiconductor layer that lie beneath the pattern. Subsequently, a heating step is applied to the semiconductor device to cause a relaxation in areas of the strained layer which do not lie beneath the semiconductor material pattern, whereby dislocations result in the relaxed areas and impair electrical transport therethrough.

6 Claims, 2 Drawing Sheets

METHOD OF PRODUCING STRAINED-LAYER SEMICONDUCTOR DEVICES VIA SUBSURFACE-PATTERNING

The United States Government has rights in this invention pursuant to contract DE-AC04-76DP00789 between the U.S. Department of Energy and American Telephone and Telegraph Company.

FIELD OF THE INVENTION

This invention relates to strained-layer semiconductor devices, and more particularly, to a method for patterning subsurface, active regions in such strained layer devices.

BACKGROUND OF THE INVENTION

A variety of semiconductor devices use strained-layer quantum well structures to achieve high-performance field effect transistors (also called SQWET's). In this class of devices, the buried quantum well serves as a spatially confined conduction path for source-drain current which may then be modulated by a gate voltage applied above the quantum well. The purpose for introducing strain into the quantum well is to optimize the device's performance by increasing carrier concentration and by reducing the effective mass of the active carriers. Unfortunately, as strain is increased in the quantum well layer, the stability of the quantum well against the introduction of misfit dislocations is reduced. Such dislocations cause serious degradation in the device's performance by providing centers for carrier recombination.

When a material is grown on a chemically similar but lattice mismatched substrate, a coherently strained layer may be formed if the lattice mismatch is sufficiently small. The lattice structure in such a coherent arrangement undergoes biaxial strains which force the lattice parameters perpendicular to the direction of growth, to become equal. As a result, a coherent structure with a homogeneous strain energy results. By contrast, in an incoherent structure, the mismatched strain is accommodated by a combination of biaxial strain and interfacial misfit dislocations. Obviously, in active devices, it is generally preferred that such dislocations be avoided.

In the prior art, when p-channel SQEFET's were fabricated the devices often showed poor performance as well as direct signs of structural degradation, such as misfit dislocations and poor photoluminescence efficiency. The implication was that the structures were meta-stable, rather than stable and that high temperature annealing, which was needed to activate ion-implanted dopants in the p-channel devices, provided conditions under which a large amount of structural relaxation had occurred.

In addition to assuring that strained quantum well devices exhibit stable strained layers, the need for electrical isolation of neighboring devices often produces a surface structure with complex morphology. Such a surface can present a significant limitation on the complexity and/or the further processing of the completed circuit. As a result, it is generally desirable, following a given series of processing steps, to restore a flat surface in order to simplify further processing steps. This procedure is called planarization.

The prior art has accomplished both buried features and planarization in a number of ways. U.S. Pat. Nos. 4,654,090 to Burnham et al., 4,771,010 to Epler et al., and 4,751,194 to Cibert et al. all describe methods for patterning a semiconductor heterostructure by disordering, (i.e. locally converting the original structure into a disordered alloy). In U.S. Pat. No. 4,751,194, ion implantation is employed for disordering; laser heating is employed in No. 4,654,090 and an "energy beam" is employed in No. 4,771,010. The regions of disordered alloy then confine transport electrons by presenting a different gap energy.

In U.S. Pat. Nos. 4,585,491 and 4,727,555, both to Burnham et al., tuning of the wavelength of quantum-well lasers is described through the use of thermal annealing. Such annealing drives interdiffusion between the quantum well and the surrounding material. These patents teach a diffusive process which takes place without any spatial patterning.

In U.S. Pat. Nos. 4,571,486 to Arai et al. and 4,605,447 to Brotherton et al. descriptions are provided of methods for selectively processing specific areas on a substrate, either for insulating a given region from the effect of a plasma, or by locally altering the reflectivity of a surface so that flashlamp heating produces different temperatures on selected regions.

In U.S. Pat. Nos. 4,835,116 to Lee et al. and 4,876,219 to Eshita et al., post-growth annealing is described to obtain a desired semiconductor structure. There is no teaching in these patents of any method for differentially annealing different regions of the semiconductor structures, nor are stability properties of strained-layer materials essential features of their described methods.

In two additional patents, No. 4,806,996 to Lauryi and No. 4,876,210 to Barnett et al., the notion of introducing special patterns into a material to obtain a final structure, not otherwise accessible, is described. In Luryi, a patterned substrate is described as providing dislocation-free epitaxial layers, whereas in Barnett et al., a lattice-graded interface layer is included between a substrate and a heteroepitaxial layer.

Accordingly, it is an object of this invention to provide a method for patterning subsurface features in a semiconductor substrate.

It is a further object of this invention to provide a subsurface patterning method wherein a planar surface morphology can be retained.

SUMMARY OF THE INVENTION

A method is described for patterning subsurface features in a semiconductor device, wherein the semiconductor device includes an internal strained layer. The method comprises creating a pattern of semiconductor material over the semiconductor device, the semiconductor material having a predetermined thickness which stabilizes areas of the strained semiconductor layer that lie beneath the pattern. Subsequently, a heating step is applied to the semiconductor device to cause a relaxation in areas of the strained layer which do not lie beneath the semiconductor material pattern, whereby dislocations result in the relaxed areas and impair electrical transport therethrough.

DETAILED DESCRIPTION OF THE INVENTION

Figure 1:
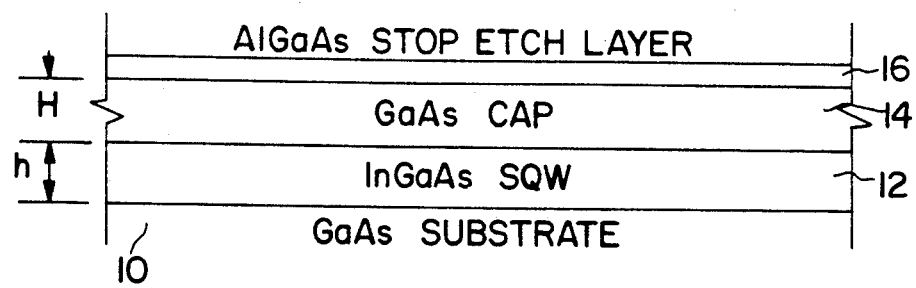
FIG. 1 is a sectional view of a semiconductor structure showing a buried, strained quantum well.

It has been determined that stability limits for a strained-layer buried under an overlayer of some finite thickness can be calculated by applying a stability model previously proposed by J. Y. Tsao & B.W. Dodson in "Excess Stress and the Stability of Strained Heterostructures", Applied Physics Letters, Vol. 53, pp. 848, 1988. An understanding of the extension of that model to achieve subsurface patterning can be gained by reference to FIG. 1 wherein a section of a semiconductor substrate is illustrated. A gallium arsenide substrate 10 has had grown thereon, an indium gallium arsenide strained quantum well 12. A gallium arsenide cap layer 14 and an aluminum gallium arsenide stop-etch layer 16 are further emplaced thereon. The thickness of gallium arsenide cap layer 14 is H and the thickness of the indium gallium arsenide strained quantum well 12 is h.

Additional definitions are as follows:

Strained layer 12 has strain E, (determined from lattice mismatch)

$h_c$ = critical thickness for an uncovered strained layer, (i.e., layer is structurally stable)

$h_c^*$ = critical thickness for a strained layer having a thick, unstrained, semiconductor overlayer For subsurface patterning, two conditions must hold 1. an uncovered, strained layer must be unstable to relaxation when $h > h_c$
2. A strained layer with a thick unstrained overlayer must be stable against relaxation when $h < h_c^*$ In sum, $h_c < h < h_c^*$. Thus for a given strain value E (fixed by the lattice mismatch), the thickness h of strained layer 12 must fall between $h_c$ and $h_c^*$.

It has been determined that $h_c$ can be found by a numerical solution to equation 1 (dimensions in nanometers)

$$h_c = \frac{Ln(10 h_c)}{40 E} \quad (1)$$

The value of $h_c^*$ is found by a numerical solution to equations 2 and 3

$$h_c^* = a\, h_c - H \quad (2)$$

$$(a - 1) h_c - H = \frac{Ln\, a}{40 E} \quad (3)$$

Ln represents the natural logarithm.

It is known (see FIG. 1) that strained quantum well layer 12 may be caused to relax and exhibit misfit dislocations by processing steps which involve the application of heat to the substrate. By applying a certain thickness cap layer 14 over quantum well layer 12, pursuant to the conditions specified above, the stability of layer 12 can be increased so that it does not "relax" under applied heat conditions.

In active devices, the thickness of cap layer 14 is substantially restricted, thereby limiting the temperatures to which the substrate can be subjected. By applying an additional layer of semiconductor material over stop-etch layer 16, in effect, the thickness of gallium arsenide cap layer 14 is increased by the added thickness of the additional layer, and substantial additional stability is imparted to quantum well layer 12. As a result, higher temperature processing may be applied to such a structure.

Figure 2:
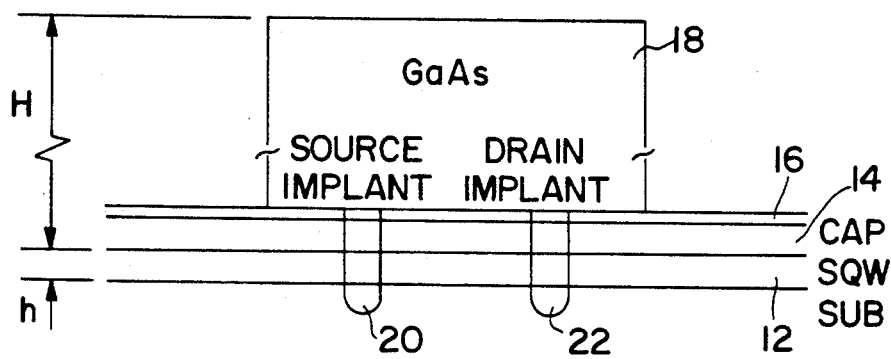
FIGS. 2–4 are sectional views of a semiconductor structure useful in understanding the various steps of the invention.
Figure 3:
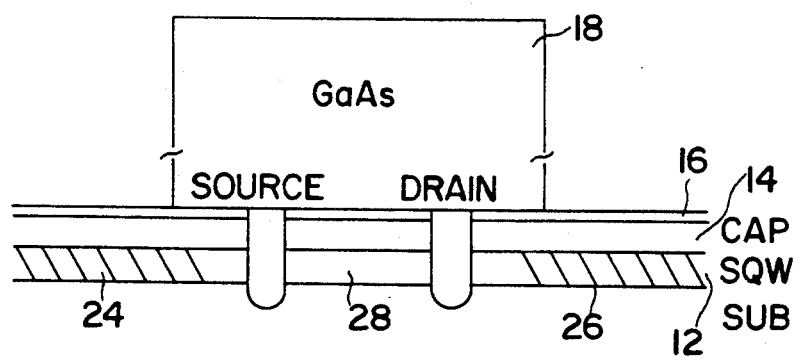
Figure 4:
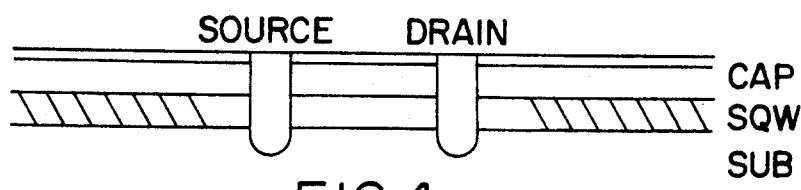

This finding is applied to patterning of strained quantum well layer 12 to enable isolation of specific devices on a single substrate. Referring to FIGS. 2-4, a gallium arsenide overlayer 18 is deposited on stop-etch layer 16. The thickness of gallium arsenide overlayer 18 is substantial (e.g., one micron), thereby lending thermodynamic stability to strained layer quantum well 12. The upper surface of the strained quantum well device is, as aforesaid, a stop-etch layer 16. This enables a flat surface to be restored, following the subsurface patterning procedure.

Prior to the deposition of gallium arsenide layer 18, source and drain regions 20 and 22 are implanted within the semiconductor substrate. Subsequently, employing standard photolithographic processes, a desired pattern of a micron-thick layer of gallium arsenide 18 is grown over the implanted regions, thus defining individual device areas. As shown in FIG. 3, the substrate is then subjected to a rapid thermal annealing to create a misfit dislocation structure in regions 24 and 26 in strained quantum well layer 12. (Those layers are indicated by crosshatching.) Area 28 immediately below gallium arsenide layer 18 remains in its original, strained configuration due to the stability created as a result of the presence of gallium arsenide layer 18.

Subsequently, gallium arsenide layer 18 is removed using a selective etch which does not effect stop-etch layer 16 and the original planar surface is restored.

As an example, given a strain $E = 0.01$ (1% lattice mismatch) and assuming $H = 1000$ nanometers (1micron), equations 1-3 give the following values: $h_c = 12$ nanometers (120Å); $a = 85$; $h_c^* = 20$ nanometers.

Figure 5:
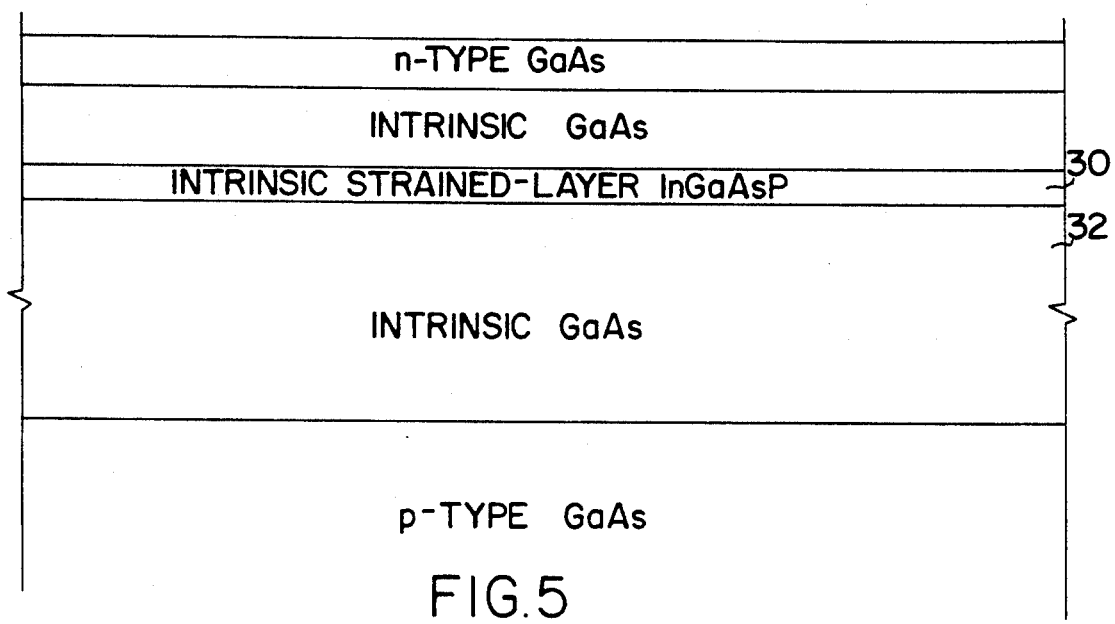
FIGS. 5 and 6 are sectional view of a semiconductor structure which indicate how the method of the inven-

Vertical device structures can also be formed using the subsurface patterning method of this invention. Referring to FIG. 5, an unpatterned gallium arsenide PIN photodetector structure is illustrated. An InGaAsP strained layer 30 is embedded in intrinsic region 32 and is not necessarily an active part of the device, but is present to allow spatial isolation of the photodetector matrix by subsurface patterning. As such, the composition is chosen to have the same band gap as gallium arsenide, while having a significant lattice mismatch (perhaps as much as 1-2%).

Figure 6:
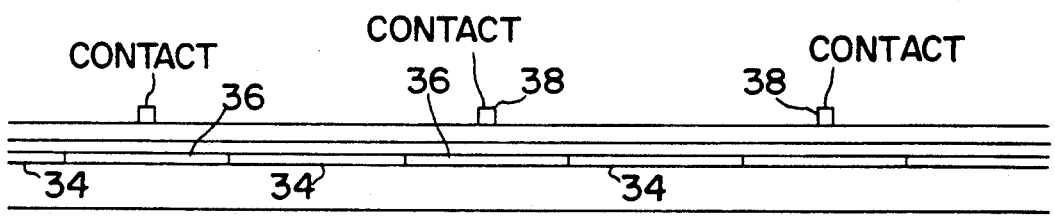

By again depositing on the upper surface of the structure in FIG. 5, a gallium arsenide pattern, using the method described for FIGS. 2-4 and subsequently thermally annealing the structure, misfit dislocations are created in strained layer 30. These are indicated in FIG. 6 by regions 34. The misfit dislocations in damaged regions 34 provide efficient centers for recombination of photoexcited carriers and thus create optically isolated regions 36. By subsequently applying contacts 38 to the surface of the device, a dense, two-dimensional matrix of vertical photodetectors can thus be fabricated.

In summary, the electrical isolation approach is particularly applicable to strained-layer devices. The procedure takes advantage of the control of structural instability of a strained-layer structure under rapid thermal annealing, to produce regions between devices which have poor electrical transport and thus provide device isolation in a planar structure. The process is further employed for providing optically isolated active regions in a semiconductive substrate.

It should be understood that the foregoing description is only illustrative of the invention. Various alternatives and modifications can be devised by those skilled in the art without departing from the invention. For instance, while GaAs, AlGaAs etc. layers have been described, the method is equally applicable to other semiconductor compositions and alloys which exhibit a similar thermal stability characteristic. Accordingly, the present invention is intended to embrace all such alternatives, modifications and variances which fall within the scope of the appended claims.

I claim:

1. A method for patterning subsurface dislocation features in a semiconductor device, wherein said semiconductor device includes a semiconductor substrate and a strained semiconductor layer, the method comprising:
   (a) creating a pattern of semiconductor material on said semiconductor device, said deposited material is of a thickness which thermodynamically stabilizes areas of said strained semiconductor layer that lie beneath said pattern; and
   (b) generating a plurality of dislocations in select areas of said strained semiconductor layer by applying heat to said semiconductor device to cause a relaxation in areas of said strained layer which do not lie beneath said semiconductor material pattern, thereby creating said plurality of dislocations in said relaxed areas.

2. The method as recited in claim 1 wherein said semiconductor device includes a planar, stop-etch layer, and said pattern of semiconductor material is created thereon, the method further comprising:
   (c) removing said pattern of semiconductor material with an etchant which does not etch said stop-etch layer, to restore a planar surface for said semiconductor device subsequent to heating said semiconductor material.

3. The method as recited in claim 1 wherein said strained semiconductor layer has a thickness h and the thickness of semiconductor material thereover, including said patterned semiconductor material is H, and wherein the value of h can be determined from:

$$h_c < h < h_c^*$$

where $$h_c = \frac{\text{Ln}(10h_c)}{40E}$$

$$h_c^* = ah_c - H$$

$$(a - 1)h_c - H = \frac{\text{Ln } a}{40E}$$

where Ln represents the natural log function, and E is the strain exhibited in said strained semiconductor layer.

4. The method as recited in claim 1 wherein said semiconductor device has a set of one or more source and drain regions formed in said substrate and in a plurality of epitaxial layers overlying said substrate and where step (b) accomplishes an annealing of said regions at the same time said dislocations are created.

5. The method as recited in claim 1 wherein said strained semiconductor layer is an active layer in said device and said dislocations create regions of impaired electrical transport.

6. The method as recited in claim 1 wherein said dislocations act as centers for recombination of photoexcited carriers when said semiconductor device is employed for photodetection purposes.

* * * * *